US010354929B2

(12) United States Patent
Pandev

(10) Patent No.: US 10,354,929 B2
(45) Date of Patent: Jul. 16, 2019

(54) MEASUREMENT RECIPE OPTIMIZATION BASED ON SPECTRAL SENSITIVITY AND PROCESS VARIATION

(71) Applicant: KLA-Tencor Corporation, Milpitas, CA (US)

(72) Inventor: Stilian Ivanov Pandev, Santa Clara, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 744 days.

(21) Appl. No.: 13/887,524

(22) Filed: May 6, 2013

(65) Prior Publication Data

US 2013/0304408 A1 Nov. 14, 2013

Related U.S. Application Data

(60) Provisional application No. 61/644,037, filed on May 8, 2012.

(51) Int. Cl.
*H01L 21/66* (2006.01)
*G01B 11/24* (2006.01)

(52) U.S. Cl.
CPC .............. *H01L 22/20* (2013.01); *G01B 11/24* (2013.01); *G01B 2210/56* (2013.01); *H01L 22/12* (2013.01); *H01L 2924/0002* (2013.01)

(58) Field of Classification Search
None
See application file for complete search history.

(56) References Cited

U.S. PATENT DOCUMENTS 7,171,284 B2 * 1/2007 Vuong ................ G03F 7/70625
438/16
7,330,279 B2 * 2/2008 Vuong .................... G03F 7/705
250/559.19

(Continued)

FOREIGN PATENT DOCUMENTS

CN 1672012 A 9/2005
CN 101359612 A 2/2009

(Continued)

*Primary Examiner* — John C Kuan
(74) *Attorney, Agent, or Firm* — Spano Law Group; Joseph S. Spano

(57) ABSTRACT

An optimized measurement recipe is determined by reducing the set of measurement technologies and ranges of machine parameters required to achieve a satisfactory measurement result. The reduction in the set of measurement technologies and ranges of machine parameters is based on available process variation information and spectral sensitivity information associated with an initial measurement model. The process variation information and spectral sensitivity information are used to determine a second measurement model having fewer floating parameters and less correlation among parameters. Subsequent measurement analysis is performed using the second, constrained model and a set of measurement data corresponding to a reduced set of measurement technologies and ranges of machine parameters. The results of the subsequent measurement analysis are compared with reference measurement results to determine if a difference between the estimated parameter values and the parameter values derived from the reference measurement is within a predetermined threshold.

20 Claims, 2 Drawing Sheets

(56) References Cited

U.S. PATENT DOCUMENTS

| | | | |
|---|---|---|---|
| 7,355,728 B2* | 4/2008 | Li | G01B 11/24 356/601 |
| 7,450,225 B1 | 11/2008 | Liu et al. | |
| 7,471,391 B2 | 12/2008 | Imura | |
| 7,523,021 B2 | 4/2009 | Vuong et al. | |
| 7,698,098 B2 | 4/2010 | Ritter et al. | |
| 7,921,383 B1 | 4/2011 | Wei | |
| 8,144,322 B2 | 3/2012 | Nagashima et al. | |
| 8,289,527 B2 | 10/2012 | Li et al. | |
| 8,296,687 B2 | 10/2012 | Mitrovic et al. | |
| 2002/0033945 A1* | 3/2002 | Xu | G01B 11/0641 356/369 |
| 2002/0182760 A1* | 12/2002 | Wack | G01N 21/211 438/14 |
| 2003/0011767 A1 | 1/2003 | Imura et al. | |
| 2003/0187604 A1 | 10/2003 | Drege et al. | |
| 2004/0017574 A1 | 1/2004 | Vuong et al. | |
| 2004/0190008 A1* | 9/2004 | Mieher | G01N 21/956 356/625 |
| 2006/0103728 A1 | 5/2006 | Ishigami et al. | |
| 2006/0290929 A1 | 12/2006 | Imura et al. | |
| 2006/0290947 A1 | 12/2006 | Li et al. | |
| 2008/0049214 A1 | 2/2008 | Maznev et al. | |
| 2008/0195342 A1 | 8/2008 | Li et al. | |
| 2010/0067004 A1 | 3/2010 | Nagashima et al. | |
| 2012/0022836 A1* | 1/2012 | Ferns | G03F 7/70625 703/2 |
| 2012/0271591 A1* | 10/2012 | Kamenev | G01B 11/0675 702/167 |
| 2012/0323356 A1 | 12/2012 | Dziura et al. | |
| 2013/0110477 A1 | 5/2013 | Pandev | |
| 2013/0262044 A1 | 10/2013 | Pandev et al. | |

FOREIGN PATENT DOCUMENTS

| | | |
|---|---|---|
| CN | 101401080 A | 4/2009 |
| JP | 2007-010364 A | 1/2007 |
| JP | 2009-008561 A | 1/2009 |
| JP | 2010-060525 A | 3/2010 |
| WO | WO2005119169 A2 | 12/2005 |

* cited by examiner

MEASUREMENT RECIPE OPTIMIZATION BASED ON SPECTRAL SENSITIVITY AND PROCESS VARIATION

CROSS REFERENCE TO RELATED APPLICATION

The present application for patent claims priority under 35 U.S.C. § 119 from U.S. provisional patent application Ser. No. 61/644,037, entitled "Method For Measuring Structures By Using Signal With Insufficient Information Content," filed May 8, 2012, the subject matter of which is incorporated herein by reference in its entirety.

TECHNICAL FIELD

The described embodiments relate to metrology systems and methods, and more particularly to methods and systems for improved measurement of structural parameters.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

Traditionally, optical metrology is performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty.

For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the parameters characterizing the target often cannot be reliably decoupled with available measurements. In another example, opaque, high-k materials are increasingly employed in modern semiconductor structures. Optical radiation is often unable to penetrate layers constructed of these materials. As a result, measurements are becoming increasingly challenging.

In response to these challenges, more complex optical tools have been developed. For example, complex structures are currently measured using multiple technologies (e.g., spectroscopic ellipsometry (SE), ultra-violet reflectometry (UVR), two-dimensional beam profile reflectometry (2D-BPR), etc.). In addition, measurements are performed over large ranges of several machine parameters (e.g., wavelength, azimuth, and angle of incidence, etc.), and often simultaneously. As a result, the measurement time, computation time, and the overall time to generate reliable results, including measurement recipes, increases significantly. In addition, the spreading of light intensity over large wavelength ranges decreases illumination intensity at any particular wavelength and increases signal uncertainty of measurements performed at that wavelength.

Future metrology applications present challenges for metrology due to increasingly small resolution requirements, multi-parameter correlation, increasingly complex geometric structures, and increasing use of opaque materials. Thus, methods and systems for improved measurements are desired.

SUMMARY

Methods and systems for generating optimized measurement recipes for metrology systems configured to measure structural and material characteristics associated with different semiconductor fabrication processes are presented.

In one aspect, an optimized measurement recipe is determined by reducing the set of measurement technologies and ranges of machine parameters required to achieve a satisfactory measurement result. The reduction in the set of measurement technologies and ranges of machine parameters is based on available process variation information and spectral sensitivity information associated with an initial measurement model.

The process variation information and spectral sensitivity information are used to determine a second measurement model having fewer floating parameters and less correlation among parameters. In this manner, the second model is effectively constrained within a subspace of expected signal responses and process variations.

Subsequent measurement analysis is performed using the second, constrained model and a set of measurement data corresponding to a reduced set of measurement technologies and ranges of machine parameters. The results of the subsequent measurement analysis are compared with reference measurement results to determine if a difference between the estimated parameter values and the parameter values derived from the reference measurement is within a predetermined threshold. If so, an optimized measurement recipe based on the reduced set of measurement technologies and ranges of machine parameters is achieved. If not, another measurement analysis is performed using the second, constrained model and another set of measurement data corresponding to a different, reduced set of measurement technologies and ranges of machine parameters. Again, the results are compared with the reference measurement results to determine if a difference between the estimated parameter values and the parameter values derived from the reference measurement is within a predetermined threshold. This process is iterated until an optimized measurement recipe based on a reduced set of measurement technologies and ranges of machine parameters is achieved.

Measurements performed based on the optimized measurement recipe are performed more quickly because of the reduced set of measurement technologies and ranges of machine parameters employed. In addition, computation time for library generation, regression, and analysis is also reduced.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
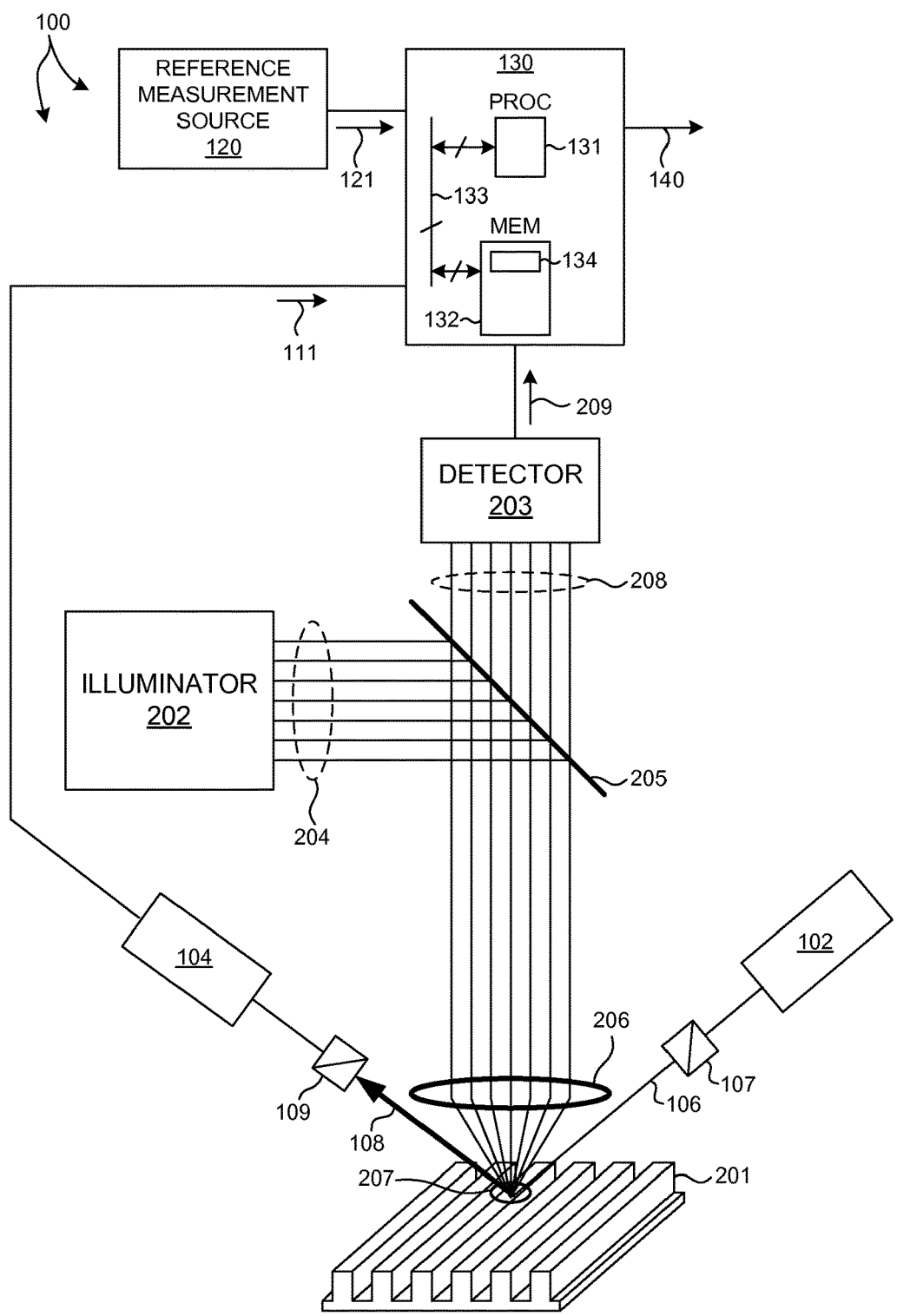
FIG. 1 is a diagram illustrative of a metrology system 100 configured to optimize a measurement recipe based on process variation information and spectral sensitivity information in accordance with the methods described herein.

Reference will now be made in detail to background examples and some embodiments of the invention, examples of which are illustrated in the accompanying drawings. Methods and systems for optimizing measurement recipes are presented. Systems employing an optimized recipe are used to measure structural and material characteristics (e.g., material composition, dimensional characteristics of structures and films, etc.) associated with different semiconductor fabrication processes.

In general, optical metrology techniques discussed herein are indirect methods of measuring physical properties of a specimen under inspection. In most cases, the measured values cannot be used to directly determine the physical properties of the specimen. The nominal measurement process consists of parameterization of the structure (e.g., film thicknesses, critical dimensions, etc.) and the machine (e.g., wavelengths, angles of incidence, polarization angles, etc.). A measurement model is created that attempts to predict the measured values. The model includes parameters associated with the machine ($P_{machine}$) and the specimen ($P_{specimen}$).

Machine parameters are parameters used to characterize the metrology tool itself. Exemplary machine parameters include angle of incidence (AOI), analyzer angle ($A_0$), polarizer angle ($P_0$), illumination wavelength, numerical aperture (NA), etc. Specimen parameters are parameters used to characterize the specimen. For a thin film specimen, exemplary specimen parameters include refractive index, dielectric function tensor, nominal layer thickness of all layers, layer sequence, etc. For measurement purposes, the machine parameters are treated as known parameters and the specimen parameters (or a subset of specimen parameters) are treated as unknown, floating parameters. The floating parameters are resolved by an iterative process (e.g., regression, library matching, etc.) that produces the best fit between theoretical predictions and experimental data. The unknown specimen parameters, $P_{specimen}$, are varied and the model output values are calculated until a set of specimen parameter values are determined that results in a close match between the model output values and the experimentally measured values.

Typically, a subset of specimen parameters to be floated in subsequent analysis is determined by evaluating the sensitivity of the measurement model to variation of each parameter. In some examples, fixed error analysis is performed to determine a suitable set of parameters to float. However, in many cases, the specimen parameters are highly correlated. This can lead to model instability. In some cases, this is resolved by fixing certain specimen parameters. However, this often results in significant errors in the estimation of the remaining parameters. In many cases, the high degree of correlation among the model parameters requires the use of multiple measurement technologies, each performed over a broad range of machine parameters (e.g., large wavelength ranges, multiple azimuth angles, and multiple angles of incidence), and even under these conditions, the models may fail. Even if measurement recipes employing multiple measurement technologies each performed over a broad range of machine parameters lead to satisfactory measurement results, the cost in terms of throughput time may be undesirable.

In one aspect, an optimized measurement recipe (e.g., set of measurement technologies and ranges of machine parameters) is determined by reducing the set of measurement technologies and ranges of machine parameters required to achieve a satisfactory measurement result. The reduction in the set of measurement technologies and ranges of machine parameters is based on available process variation information and spectral sensitivity information associated with an initial measurement model. More specifically, the process variation information and spectral sensitivity information are used to determine a second measurement model having fewer floating parameters and less correlation among parameters. In this manner, the second model is effectively constrained within a subspace of expected signal responses and process variations.

Subsequent measurement analysis is performed using the second, constrained model and a set of measurement data corresponding to a reduced set of measurement technologies and ranges of machine parameters. The results of the subsequent measurement analysis are compared with reference measurement results to determine if a difference between the estimated parameter values and the parameter values derived from the reference measurement is within a predetermined threshold. If so, an optimized measurement recipe based on the reduced set of measurement technologies and ranges of machine parameters is achieved. If not, another measurement analysis is performed using the second, constrained model and another set of measurement data corresponding to a different, reduced set of measurement technologies and ranges of machine parameters. Again, the results are compared with the reference measurement results to determine if a difference between the estimated parameter values and the parameter values derived from the reference measurement is within a predetermined threshold. This process is iterated until an optimized measurement recipe based on a reduced set of measurement technologies and ranges of machine parameters is achieved.

Measurements performed based on the optimized measurement recipe are performed more quickly because of the reduced set of measurement technologies and ranges of machine parameters employed. In addition, computation time for library generation, regression, and analysis is also reduced.

In some examples, accuracy, precision and model stability are improved within the constrained solution space that corresponds to the available process variation information and spectral sensitivity information. In addition, in some examples, measurement systems employing high intensity light sources within limited wavelength ranges is enabled by the optimized measurement recipe.

FIG. 1 illustrates a system 100 for measuring characteristics of a specimen in accordance with the exemplary methods presented herein. As shown in FIG. 1, the system 100 may be used to perform spectroscopic ellipsometry measurements and 2D-BPR measurements of one or more structures of a specimen 201. In this aspect, the system 100 may include a spectroscopic ellipsometer equipped with an illuminator 102 and a spectrometer 104. The illuminator 102 of the system 100 is configured to generate and direct illumination of a selected wavelength range (e.g., 150-850 nm) to the structure disposed on the surface of the specimen 201. In turn, the spectrometer 104 is configured to receive illumination reflected from the surface of the specimen 201. It is further noted that the light emerging from the illuminator 102 is polarized using a polarization state generator 107 to produce a polarized illumination beam 106. The radiation reflected by the structure disposed on the specimen 201 is passed through a polarization state analyzer 109 and to the spectrometer 104. The radiation received by the spectrometer 104 in the collection beam 108 is analyzed with regard to polarization state, allowing for spectral analysis by the spectrometer of radiation passed by the analyzer. These spectra 111 are passed to the computing system 130 for analysis of the measured structure.

As depicted in FIG. 1, system 100 also includes a 2D-BPR system configured to detect light diffracted from a specimen under inspection and analyze the detected signals indicative of structural irregularities. The 2D-BPR system includes an illuminator 202 that delivers an illumination light 204. Illumination light 204 is directed toward a high-NA objective lens 206 by beam splitter 205. In a preferred embodiment, objective lens 206 has a numerical aperture of approximately 0.9. However, in some other embodiments, objective lens 206 may have a NA less than 0.9. In yet some other embodiments, objective lens 206 may have a NA greater than 0.9. For example, an objective lens 206 operating in an immersion system may have a NA greater than 0.9. Objective lens 206 simultaneously illuminates specimen 201 over an illumination area (i.e., illumination spot) 207 and collects diffracted light from specimen 201 over a wide range of angles. Field stops and apodizers (not shown) may be used to control spatial properties of illumination and collection beams. The collected light 208 is directed to detector 203 via beam splitter 205. In the depicted embodiment, detector 203 is a two dimensional array of charge coupled devices (CCD). Detector 203 detects collected light 208 and generates output signals 209 indicative of a pupil image of illumination area 207.

In some embodiments, illumination light 204 includes several wavelength channels. For example, illumination light 204 may be provided by multiple, different lasers. In some embodiments, the 2D-BPR system includes different optical channels having different polarization and a waveplate to collect and measure relative phase difference between polarizations (not shown). In some embodiments, illuminator 202 is configured to provide multiple wavelengths simultaneously (e.g., a super-continuum laser source, a lamp source, or a laser-driven light source such as a laser sustained plasma).

As depicted in FIG. 1, system 100 includes multiple measurement technologies (i.e., SE and 2D-BPR). However, in general, system 100 may include any number of different measurement technologies. By way of non-limiting example, system 100 may be configured as a spectroscopic ellipsometer (including Mueller matrix ellipsometry), a spectroscopic reflectometer, a spectroscopic scatterometer, an overlay scatterometer, an angular resolved beam profile reflectometer, a polarization resolved beam profile reflectometer, a beam profile ellipsometer, any single or multiple wavelength ellipsometer, or any combination thereof. Furthermore, in general, measurement data collected by different measurement technologies and analyzed in accordance with the methods described herein may be collected from multiple tools, rather than one tool integrating multiple technologies.

In a further embodiment, system 100 may include one or more computing systems 130 employed to generate an optimized measurement recipe by reducing the set of measurement technologies and ranges of machine parameters required to achieve a satisfactory measurement result in accordance with the methods described herein. In one embodiment, the one or more computing systems 130 are communicatively coupled to the spectrometer 104 and detector 203. The one or more computing systems 130 are configured to receive measurement data 111 and 209 associated with measurements of the structure of specimen 201.

In addition, in some embodiments, the one or more computing systems 130 are further configured to receive a set of reference measurement data 121 associated with a measurement of the specimen 201 by a reference measurement source 120. In some examples, the reference measurement data 121 is stored in memory (e.g., memory 132) and retrieved by computing system 130. In some embodiments, a reference measurement source 120 is another metrology tool capable of highly accurate measurements of a target structure (e.g., TEM, SEM, X-Ray scatterometer, etc.).

In a further embodiment, the one or more computing systems 130 are configured to access model parameters in real-time, employing Real Time Critical Dimensioning (RTCD), or it may access libraries of pre-computed models for determining an optimized measurement recipe in accordance with the methods described herein.

It should be recognized that the various steps described throughout the present disclosure may be carried out by a single computer system 130 or, alternatively, a multiple computer system 130. Moreover, different subsystems of the system 100, such as the spectroscopic ellipsometer 104, may include a computer system suitable for carrying out at least a portion of the steps described herein. Therefore, the aforementioned description should not be interpreted as a limitation on the present invention but merely an illustration. Further, the one or more computing systems 130 may be configured to perform any element of any of the exemplary methods described herein.

In addition, the computer system 130 may be communicatively coupled to the spectrometer 104 and detector 203 in any manner known in the art. For example, the one or more computing systems 130 may be coupled to computing systems associated with the spectrometer 104 and detector 203, respectively. In another example, any of the spectrometer 104 and detector 203 may be controlled directly by a single computer system coupled to computer system 130.

The computer system 130 of the metrology system 100 may be configured to receive and/or acquire data or information from the subsystems of the system (e.g., spectrometer 104, detector 203, and the like) by a transmission medium that may include wireline and/or wireless portions. In this manner, the transmission medium may serve as a data link between the computer system 130 and other subsystems of the system 100.

Computer system 130 of the integrated metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, reference measurement source 120, or other external systems). For example, the computing system 130 may be configured to receive measurement data from a storage medium (i.e., memory 132 or an external memory) via a data link. For instance, spectral results obtained using spectrometer 104 may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, an optimized measurement recipe including a reduced set of measurement technologies and machine parameter values determined by computer system 130 may be communicated (e.g., via output signal 140) and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 2:
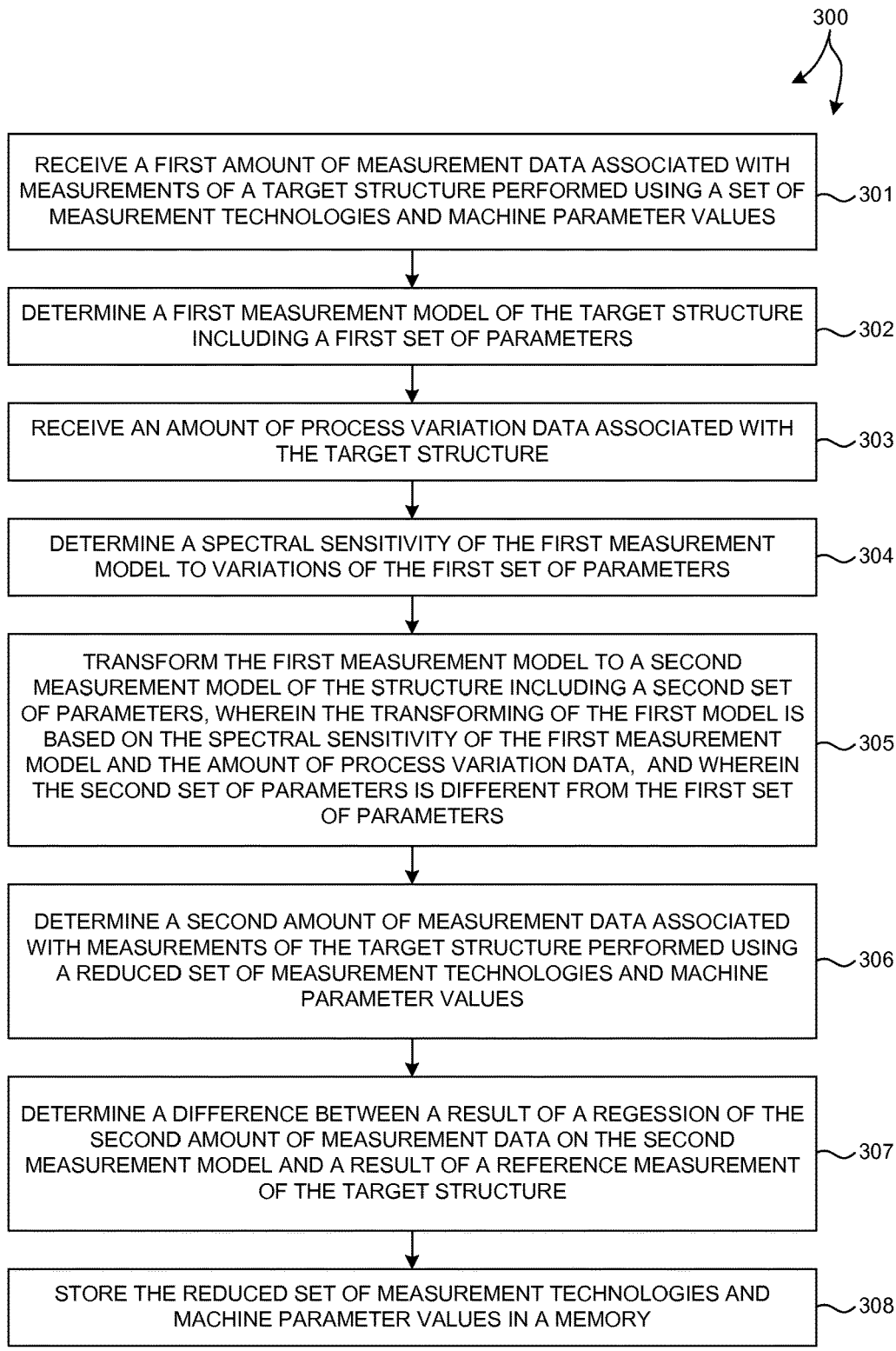
FIG. 2 is a flowchart illustrative of an exemplary method 300 of optimizing a measurement recipe based on process variation information and spectral sensitivity information.

FIG. 2 illustrates a method 300 suitable for implementation by the metrology system 100 of the present invention. In one aspect, it is recognized that data processing blocks of method 300 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 301, a first amount of measurement data associated with measurements of a target structure is received. The measurement data is based on measurements of the target structure performed using a set of measurement technologies and machine parameter values. The set of measurement technologies and machine parameter values includes at least one measurement technology and machine parameter values associated with each measurement technology. In general, the set of measurement technologies and machine parameter values is an expanded set of measurement technologies and machine parameter values in the sense that the scope of measurements is thorough, but may require an undesirable amount of time for data collection and analysis.

In one example, the first amount of measurement data includes measurement data 209 measured over a broad range of wavelengths by the 2D-BPR metrology subsystem illustrated in FIG. 1. In addition, the first amount of measurement data includes measurement data 111 measured over a broad range of wavelengths and polarization angles by the SE metrology subsystem illustrated in FIG. 1. In general, the first amount of measurement data includes a broad range of data. The collection of this amount of data as part of a routine measurement recipe might be undesirable due to the amount of time required for data collection and analysis.

In block 302, a first measurement model of the target structure is determined. The measurement model includes a first set of parameters. The parameters may include geometric parameters, material parameters, and other parameters. Such measurement models may be generated by computing system 130 using a modeling and library-generation package such as AcuShape™, available from KLA-Tencor, Corp., San Jose, Calif.

In block 303, an amount of process variation data associated with the target structure is received. In some embodiments, process variation data is generated from actual process data, such as data physically measured in a process flow (e.g., measurements taken at any point in a semiconductor wafer fabrication process flow). In some examples, process variation data may be generated based on measurements performed by a reference measurement source 120. In some other examples, process variation data may be generated based on measurements performed by system 100 using the first measurement model, but fitting on measurement data collected using a different set of measurement technologies and machine parameter values.

In some other embodiments, process variation data is model based. For example, a process simulator (e.g., PROLITH™ simulator available from KLA-Tencor, Corp., San Jose, Calif.) may be employed to simulate changes in a target structure based on variations within a process window to generate process variation data.

In some other examples, process variation data is defined by the user. For example, process variation data may be described by equations defining relationships among parameters. In another example, process variation data may be described by one or more correlation matrices defining relationships among parameters. In another example, process variation data may be defined by selecting a set of expected profiles.

The process variation data defines, or is used to define, realistic, physical constraints on parameters of the first measurement model (e.g., variation ranges of model parameters). Exemplary parameters include bottom critical dimension (BCD), top critical dimension (TCD), middle critical dimension (MCD), sidewall angle (SWA), etc.

Exemplary methods and systems for model optimization based on process variation are described in U.S. patent application Ser. No. 13/286,079 assigned to KLA-Tencor Corporation, and published on May 2, 2013, under U.S. Patent Publication No. 2013/0110477 A1, the entirety of which is incorporated herein by reference.

In block 304, the spectral sensitivity of the first measurement model to variations of the first set of parameters is determined. For example, the spectral sensitivity of the first measurement model may be determined by a finite difference method involving perturbations of model parameters. In some examples, the spectral sensitivity of the first measurement model is evaluated by computing system 130 for each machine parameter value associated with the measurements of the target structure performed using the set of measurement technologies and machine parameter values. In some other examples, the spectral sensitivity of the first measurement model is evaluated for a subset of the machine parameter values associated with the measurements of the target structure performed using the set of measurement technologies and machine parameter values.

Exemplary methods and systems for model optimization based on spectral sensitivity are described in U.S. patent application Ser. No. 13/781,474, assigned to KLA-Tencor Corp., and published on Oct. 3, 2013, under U.S. Patent Publication No. 2013/0262044 A1, the entirety of which is incorporated herein by reference.

In block 305, the first measurement model is transformed to a second measurement model of the structure including a second set of parameters. The transforming of the first model to the second model is based on the spectral sensitivity of the first measurement model and the amount of process variation data. Furthermore, the second set of parameters is different from the first set of parameters. In addition, the second set of parameters includes fewer parameters than the first set of parameters. The reduction in the number of parameters and the reduced correlation among the second set of parameters relative to the first number of parameters contributes to increased model stability and computational speed.

Spectral sensitivity information and process variation information are used to determine a new parameterization (i.e., the second set of parameters) that minimizes parameter correlation by transformation. In general, these operations involve working with signals measured as a function of the different machine parameters (e.g., wavelength, polarization angle, state of coherence, etc.). In some examples, principal components analysis (PCA) is employed to generate the second model. Nominal values and ranges are defined for the second set of parameters. In this manner, the first set of parameters is constrained as a function of the second set of parameters.

In block 306, a second amount of measurement data associated with measurements of the target structure is determined. The second amount of measurement data is associated with measurements performed using a reduced set of measurement technologies and machine parameter values. In other words, the second amount of measurement data includes measurement data associated with a subset of the measurement technologies and machine parameter values included in the original set. In some examples, the second amount of measurement data is extracted from the originally received measurement data, for example, by computing system 130. In some other examples, the second amount of measurement data is received based on measurements performed by system 100 using the reduced set of measurement technologies and machine parameter values.

In some examples, the selection of the reduced set of measurement technologies and machine parameter values is based on available technologies and practical limitations (e.g., computation time, measurement technologies with large signal to noise ratio, but limited wavelength range, etc.). In some examples, the selection of the reduced set of measurement technologies and machine parameter values is based on an algorithmic search through the space of available measurement technologies and machine parameter values.

In block 307, a difference is determined between a result of a regression of the second amount of measurement data on the second measurement model and a result of a reference measurement of the target structure. The regression of the second amount of measurement data on the second measurement model provides an estimate of the structural parameter values of the target structure based on measurements with the reduced set of measurement technologies and machine parameter values. The quality of this estimate is checked against a reference measurement (e.g., reference measurement data 121) to ensure that measurements performed with the reduced set of measurement technologies and machine parameter values are sufficiently accurate. In some examples, the reference measurement could be a measurement of the target structure performed by another measurement technology (e.g., TEM, SEM, X-Ray scatterometry, etc.). In some other examples, the reference measurement could be a regression of the second model on the originally received measurement data (e.g., measurement data 111 and 209). In some other examples, the reference measurement could be the second amount of measurement data (e.g., a subset of measurement data 111 and 209). In this example, the errors of the regression of the second amount of measurement data on the second measurement model are an indicator of measurement accuracy.

In block 308, the reduced set of measurement technologies and machine parameter values is stored in a memory. In one example, the reduced set of measurement technologies and machine parameter values is stored as part of an optimized measurement recipe for the target structure. The reduced set of measurement technologies and machine parameter values may be stored on-board the measurement system 100, for example, in memory 132, or may communicated (e.g., via output signal 140) to an external memory device.

In a further embodiment, an optimized measurement recipe is provided if the difference is less than a threshold value. The optimized measurement recipe includes the reduced set of measurement technologies and machine parameter values. The threshold value can be any metric useful to characterize differences between the result of a regression of the second amount of measurement data on the second measurement model and a result of a reference measurement of the target structure.

However, if the difference is greater than the threshold value, a third amount of measurement data associated with a second reduced set of measurement technologies and machine parameter values is determined. A regression of the third amount of measurement data on the second measurement model provides an estimate of the structural parameter values of the target structure based on measurements with the second reduced set of measurement technologies and machine parameter values. This second reduced set of measurement technologies and machine parameter values can then be tested against reference measurements as described hereinbefore to determine whether the proposed set of measurement technologies and machine parameter values delivers a satisfactory measurement result. This iteration may continue until a satisfactory set of measurement technologies and machine parameter values is identified.

As discussed hereinbefore, the reduction in the number of measurement technologies and machine parameter values may provide desirable improvements in throughput and parameter estimation accuracy. However, in addition to reducing the number of measurement technologies and machine parameter values, reducing the number of degrees of freedom of the reparameterized model may also provide similar benefits. As such, the transformation of the first model to the second model may be revisited in an iterative manner to reduce the number of parameters.

In general, the systems and methods described herein can be implemented as part of the process of preparing an optimized measurement recipe for off-line or on-tool measurement. In addition, both measurement models and any reparameterized measurement model may describe one or more target structures.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
providing a first amount of illumination light over a first range of illumination wavelengths to a target structure disposed on a semiconductor wafer, the first amount of illumination light provided by an illuminator of a first semiconductor metrology system;
detecting a first amount of light from the target structure in response to the first amount of illumination light provided to the semiconductor wafer, the first amount of light detected by a detector of the first semiconductor metrology system;
providing a second amount of illumination light over a second range of illumination wavelengths to the target structure disposed on the semiconductor wafer, the second amount of illumination light provided by an illuminator of a second semiconductor metrology system;
detecting a second amount of light from the target structure in response to the second amount of illumination light provided to the semiconductor wafer, the second amount of light detected by a detector of the second semiconductor metrology system;
generating a first amount of measurement data from the first amount of detected light and a second amount of measurement data from the second amount of detected light;

determining a first measurement model of the target structure parameterized by a first set of parameters including machine parameters and specimen parameters including a specimen parameter of interest;

receiving an amount of process variation data associated with the target structure;

determining a spectral sensitivity of the first measurement model to variations of the first and second ranges of illumination wavelengths;

transforming the first measurement model to a second measurement model of the structure parameterized by a second set of parameters, wherein the transforming of the first model is based on the spectral sensitivity of the first measurement model and the amount of process variation data, and wherein the second set of parameters is different from the first set of parameters;

providing a third amount of illumination light over a reduced range of illumination wavelengths to the target structure disposed on the semiconductor wafer, the third amount of illumination light provided by the illuminator of a selected semiconductor metrology system, wherein the selected semiconductor metrology system is either the first or second semiconductor metrology system;

detecting a third amount of light from the target structure in response to the third amount of illumination light provided to the target structure, the third amount of light detected by the detector of the selected semiconductor metrology system;

generating a third amount of measurement data based on the third amount of detected light;

determining if a difference between an estimated value of the specimen parameter of interest based on a regression of the third amount of measurement data on the second measurement model and a value of the specimen parameter of interest based on a measurement of the target structure by a reference measurement system exceeds a threshold value; and storing the reduced range of illumination wavelengths and the selected semiconductor metrology system in a memory if the difference does not exceed the threshold value.

2. The method of claim 1, wherein the first semiconductor metrology system is a spectroscopic ellipsometer and the first amount of measurement data comprises spectral measurement data, and wherein the second semiconductor metrology system is a two dimensional beam profile reflectometer and the second amount of measurement data comprises pupil image data.

3. The method of claim 1, further comprising:
determining a fourth amount of measurement data associated with measurements of the target structure performed using a further reduced range of illumination wavelengths if the difference does exceed the threshold value.

4. The method of claim 1, wherein the specimen parameter of interest is a critical dimension.

5. The method of claim 1, wherein the transforming the first model of the structure to the second model of the structure involves reducing a number of degrees of freedom of the first set of parameters to a smaller number of degrees of freedom of the second set of parameters.

6. The method of claim 1, wherein the amount of process variation data includes any of a constraint equation defining a relationship between two or more parameters, a correlation matrix defining the relationship between two or more parameters, and a set of expected profiles selected by a user.

7. The method of claim 1, wherein the first and second models describe multiple targets.

8. A system to generate an optimized measurement recipe based on spectral sensitivity and process variation data, the system comprising:
a first metrology system including an illumination source configured to provide a first amount of illumination light including a first range of illumination wavelengths to a target structure disposed on a semiconductor wafer and a detector configured to detect a first amount of light from a portion of the semiconductor wafer in response to the first amount of illumination light provided to the semiconductor wafer and generate a first amount of measurement data from the first amount of detected light;

a second metrology system including an illumination source configured to provide a second amount of illumination light including a second range of illumination wavelengths to a target structure disposed on a semiconductor wafer and a detector configured to detect a second amount of light from a portion of the semiconductor wafer in response to the second amount of illumination light provided to the semiconductor wafer and generate a second amount of measurement data from the second amount of detected light;

a computing system configured to:
determine a first measurement model of the target structure parameterized by a first set of parameters including machine parameters and specimen parameters including a specimen parameter of interest;

receive an amount of process variation data associated with the target structure;

determine a spectral sensitivity of the first measurement model to variations of the first and second ranges of illumination wavelengths;

transform the first measurement model to a second measurement model of the structure including a second set of parameters, wherein the transforming of the first model is based on the spectral sensitivity of the first measurement model and the amount of process variation data, and wherein the second set of parameters is different from the first set of parameters;

determine a difference between a result of a regression of a third amount of measurement data on the second measurement model and a result of a reference measurement of the target structure; and store a reduced range of wavelengths and a selected semiconductor metrology system in a memory if the difference does not exceed a threshold value, wherein the third amount of measurement data is based on a third amount of light detected by a detector of the selected semiconductor metrology system in response to a third amount of illumination light provided to the target structure over the reduced range of illumination wavelengths, and wherein the selected metrology system is either the first or second metrology system.

9. The system of claim 8, wherein the first semiconductor metrology system is a spectroscopic ellipsometer and the first amount of measurement data comprises spectral measurement data, and wherein the second semiconductor metrology system is a two dimensional beam profile reflectometer and the second amount of measurement data comprises pupil image data.

10. The system of claim 8, wherein the computing system is further configured to:

determine a fourth amount of measurement data associated with measurements of the target structure performed using a further reduced set of illumination wavelengths if the difference does exceed the threshold value.

11. The system of claim 8, wherein the first set of parameters includes at least one geometric parameter and at least one dispersion parameter.

12. The system of claim 8, wherein the transforming the first model of the structure to the second model of the structure involves reducing a number of degrees of freedom of the first set of parameters to a smaller number of degrees of freedom of the second set of parameters.

13. The system of claim 8, wherein the amount of process variation data includes any of a constraint equation defining a relationship between two or more parameters, a correlation matrix defining the relationship between two or more parameters, and a set of expected profiles selected by a user.

14. The system of claim 8, wherein the first and second models describe multiple targets.

15. A measurement system, comprising:
- a first metrology system including an illumination source configured to provide a first amount of illumination light including a first range of illumination wavelengths to a target structure disposed on a semiconductor wafer and a detector configured to detect a first amount of light from a portion of the semiconductor wafer in response to the first amount of illumination light provided to the semiconductor wafer and generate a first amount of measurement data from the first amount of detected light;
- a second metrology system including an illumination source configured to provide a second amount of illumination light including a second range of illumination wavelengths to a target structure disposed on a semiconductor wafer and a detector configured to detect a second amount of light from a portion of the semiconductor wafer in response to the second amount of illumination light provided to the semiconductor wafer and generate a second amount of measurement data from the second amount of detected light;
- a non-transitory, computer-readable medium, comprising:
- code for causing the computer to determine a first measurement model of the target structure parameterized by a first set of parameters including machine parameters and specimen parameters including a specimen parameter of interest;
- code for causing the computer to receive an amount of process variation data associated with the target structure;
- code for causing the computer to determine a spectral sensitivity of the first measurement model to variations of the first and second ranges of illumination wavelengths;
- code for causing the computer to transform the first measurement model to a second measurement model of the structure including a second set of parameters, wherein the transforming of the first model is based on the spectral sensitivity of the first measurement model and the amount of process variation data, and wherein the second set of parameters is different from the first set of parameters;
- code for causing the computer to determine a difference between a result of a regression of a third amount of measurement data on the second measurement model and a result of a reference measurement of the target structure; and
- code for causing the computer to store a reduced range of wavelengths and a selected semiconductor metrology system in a memory if the difference does not exceed a threshold value, wherein the third amount of measurement data is based on a third amount of light detected by a detector of the selected semiconductor metrology system in response to a third amount of illumination light provided to the target structure over the reduced range of illumination wavelengths, and wherein the selected metrology system is either the first or second metrology system.

16. The measurement system of claim 15, wherein the first semiconductor metrology system is a spectroscopic ellipsometer and the first amount of measurement data comprises spectral measurement data, and wherein the second semiconductor metrology system is a two dimensional beam profile reflectometer and the second amount of measurement data comprises pupil image data.

17. The measurement system of claim 15, the non-transitory, computer-readable medium, further comprising:
- code for causing the computer to determine a fourth amount of measurement data associated with measurements of the target structure performed using a further reduced set of illumination wavelengths if the difference does exceed the threshold value.

18. The measurement system of claim 15, the non-transitory, computer-readable medium, wherein the first set of parameters includes at least one geometric parameter and at least one dispersion parameter.

19. The measurement system of claim 15, the non-transitory, computer-readable medium, wherein the transforming the first model of the structure to the second model of the structure involves reducing a number of degrees of freedom of the first set of parameters to a smaller number of degrees of freedom of the second set of parameters.

20. The measurement system of claim 15, the non-transitory, computer-readable medium, wherein the amount of process variation data includes any of a constraint equation defining a relationship between two or more parameters, a correlation matrix defining the relationship between two or more parameters, and a set of expected profiles selected by a user.

* * * * *